United States Patent [19]

Davis

[11] 4,357,678

[45] Nov. 2, 1982

[54] PROGRAMMABLE SEQUENTIAL LOGIC ARRAY MECHANISM

[75] Inventor: Gordon T. Davis, Pompano Beach, Fla.

[73] Assignee: International Business Machines Corporation, Armonk, N.Y.

[21] Appl. No.: 106,824

[22] Filed: Dec. 26, 1979

[51] Int. Cl.³ .............................................. G06F 7/00
[52] U.S. Cl. ................................... 364/900; 307/465
[58] Field of Search ... 364/200 MS File, 900 MS File, 364/716; 307/465

[56] References Cited

U.S. PATENT DOCUMENTS

| | | | |
|---|---|---|---|
| 3,611,309 | 10/1971 | Zingg | 364/200 |
| 3,936,812 | 2/1976 | Cox et al. | 364/900 |
| 3,975,623 | 8/1976 | Weinberger | 235/152 |
| 3,983,538 | 9/1976 | Jones | 364/900 |
| 4,132,979 | 1/1979 | Heeren | 364/900 |

OTHER PUBLICATIONS

IBM Technical Disclosure Bulletin, vol. 20, No. 2, Jul. 1977, p. 745.

Primary Examiner—Felix D. Gruber
Assistant Examiner—John G. Mills, III
Attorney, Agent, or Firm—Richard E. Bee

[57] ABSTRACT

A programmable sequential logic array mechanism is provided for performing logical operations and solving logical equations. The mechanism includes a search array subsystem for receiving a plurality of binary input signals. The search array subsystem includes an addressable storage array for supplying input control words for testing for different input signal conditions. The sequential logic array mechanism also includes a read array subsystem for producing a plurality of binary output signals. This read array subsystem includes an addressable storage array for supplying output signal control words. The results of the tests performed by the search array subsystem are used to select which ones of the output signal control words are allowed to establish or change the read array output signals.

11 Claims, 10 Drawing Figures

| INPUT | SELECT | COMPARE | OUTPUT | FUNCTION |
|---|---|---|---|---|
| DON'T CARE | 0 | 1 | 1 | DESELECT |
| A | 1 | 0 | A | NO INVERT |
| A | 1 | 1 | $\overline{A}$ | INVERT |

| STORAGE OUTPUT | | | | FUNCTION |
|---|---|---|---|---|
| A·B | A·B̄ | Ā·B | Ā·B̄ | |
| 0 | 0 | 0 | 0 | NOT USED |
| 0 | 0 | 0 | 1 | NOT A AND NOT B |
| 0 | 0 | 1 | 0 | NOT A AND B |
| 0 | 0 | 1 | 1 | NOT A |
| 0 | 1 | 0 | 0 | A AND NOT B |
| 0 | 1 | 0 | 1 | NOT B |
| 0 | 1 | 1 | 0 | A UNEQUAL TO B |
| 0 | 1 | 1 | 1 | NOT A OR NOT B |
| 1 | 0 | 0 | 0 | A AND B |
| 1 | 0 | 0 | 1 | A EQUAL B |
| 1 | 0 | 1 | 0 | B |
| 1 | 0 | 1 | 1 | NOT A OR B |
| 1 | 1 | 0 | 0 | A |
| 1 | 1 | 0 | 1 | A OR NOT B |
| 1 | 1 | 1 | 0 | A OR B |
| 1 | 1 | 1 | 1 | DESELECT |

FIG. 6

PROGRAMMABLE SEQUENTIAL LOGIC ARRAY MECHANISM

DESCRIPTION

1. Technical Field

This invention relates to logic arrays and particularly to programmable logic arrays for performing logical operations and solving logical equations.

Programmable logic arrays are useful in the digital computer arts and the digital control system arts for solving various logical relationships and providing various manufacturing and process control functions.

2. Background Art

Various forms of programmable logic arrays are presently known. An existing definition is that a programmable logic array (PLA) is a fixed orderly structure of logic circuits that can be personalized to perform a specific set of logic equations. Typically, a PLA includes an input AND array connected by a goodly number of product or word lines to an output OR array, with all of this structure being fabricated on a single integrated circuit chip.

Two known types of PLA's are mask programmable logic arrays and field programmable logic arrays. Mask programmable logic arrays are programmed or personalized to perform a desired logic function only by altering the metalization mask used to fabricate the PLA integrated circuit chip. The making of such masks and the fabrication of the integrated circuit chips is a relatively expensive and time consuming process.

Field programmable logic arrays, on the other hand, are integrated circuit chips which contain complete sets of logic circuits, each of which is operatively connected to the array structure. Each such elemental logic circuit, however, includes a fuse link which can be electrically blown or burned out so as to disable that particular circuit. The user buys the chip with the complete array of circuits on it and then plugs it in to a special machine which he has programmed to burn out the fuseable links for the undesired circuits.

While useful in various applications, these field programmable logic arrays have various drawbacks. For one thing, they are somewhat more expensive because of the need to provide the special fuseable links. Also, in order to make changes in the logic, it is necessary to start all over again with a new chip and to burn in a completely new pattern. The old previously programmed chip or module cannot be reused.

SUMMARY OF INVENTION

This invention provides novel mechanisms which employ ordinary general-purpose storage arrays for accomplishing the same logical operations as can be accomplished by the existing types of programmable logic arrays. In other words, the mechanisms of the present invention simulate the logic of a PLA using ordinary addressable random access storage arrays. These storage arrays can be, for example, read/write storage arrays of either the bipolar or field effect transistor type. In some applications, it will be more advantageous to employ so-called eraseable Programmable read only memory (EPROM) devices as the storage elements.

The use of ordinary storage circuits and devices reduces the cost factor and also eliminates the delays sometimes encountered in ordering and receiving known types of PLA's with the desired customized personalization. Also, the use of read/write type storage devices and eraseable type storage devices makes it relatively easy to change the logical operations being performed by the mechanism.

As will be seen, the logic array mechanisms of this invention solve the various logical product terms in a sequential manner, as opposed to the simultaneous manner employed by existing PLA devices. Thus, the mechanisms of this invention are referred to herein as "sequential logic arrays". The sequential nature of this invention means that its speed of operation will be somewhat slower than that of existing PLA devices. Nevertheless, the speed of operation of these sequential logic array mechanisms is more than adequate for many applications. For example, a sequential logic array constructed in accordance with this invention can perform a complete set of logical operations in approximately 25 to 150 microseconds, depending on the particular type of storage devices used. Thus, among other things, the present invention is very well suited for use in machine tool and process control applications. In such applications, it is substantially less expensive and operates considerably faster than existing types of programmable controllers and microprocessor based controllers.

For a better understanding of the present invention, together with other and further advantages and features thereof, reference is made to the following description taken in connection with the accompanying drawings, the scope of the invention being pointed out in the appended claims.

BRIEF DESCRIPTION OF THE DRAWINGS

Referring to the drawings:

FIG. 6 is a chart used in explaining the operation of the FIG. 5 embodiment;

DESCRIPTION OF THE PREFERRED EMBODIMENTS

Figure 1:
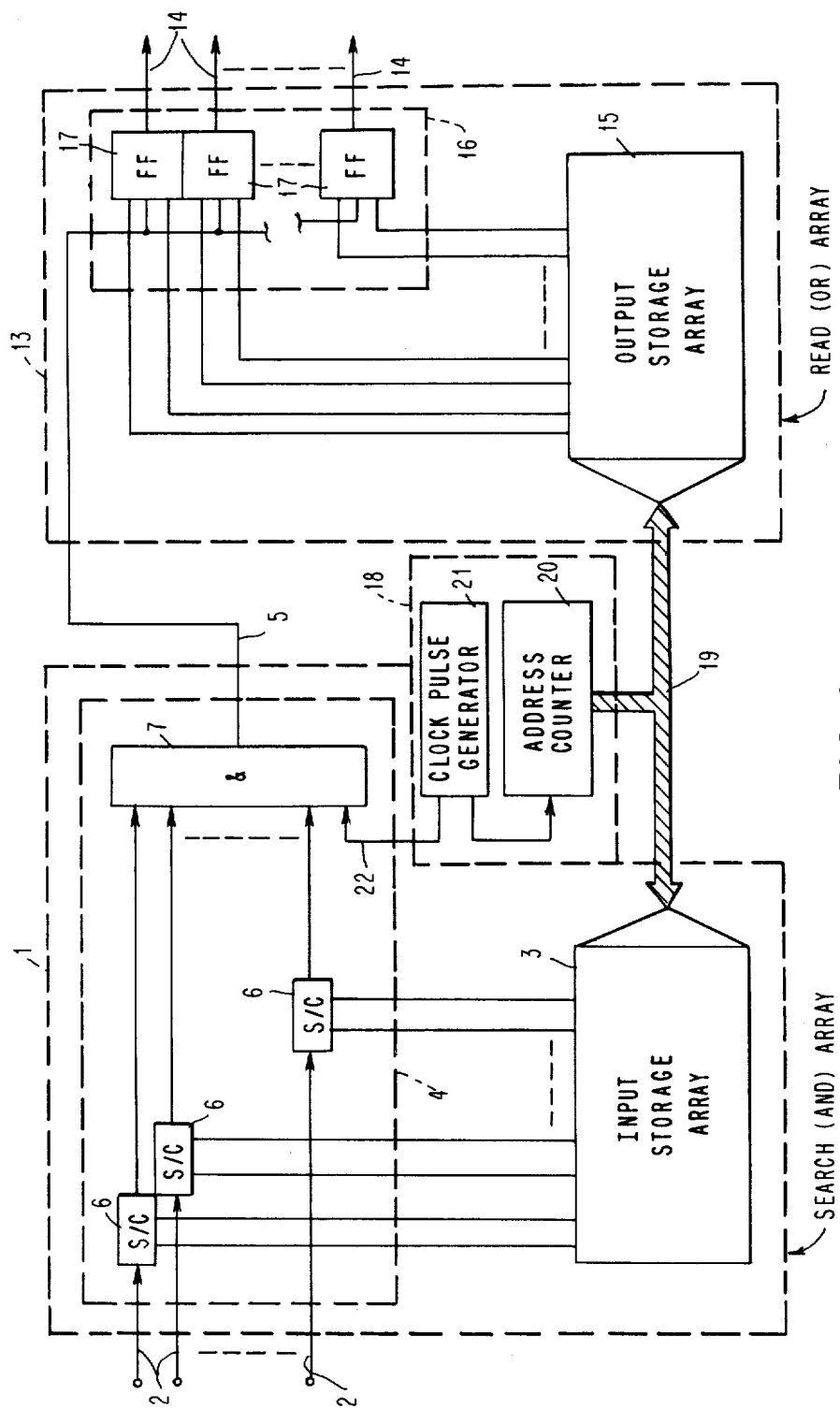
FIG. 1 shows a first embodiment of a sequential logic array mechanism constructed in accordance with the present invention.

Referring to FIG. 1, there is shown a representative embodiment of a programmable sequential logic array mechanism constructed in accordance with the present invention for performing logical operations and solving logical equations. This sequential logic array mechanism includes a search array (AND array) subsystem 1 for receiving in parallel a plurality of binary input signals via input signal lines 2. The search array subsystem 1 includes an addressable storage array 3 for supplying control words for testing different input signal conditions. This input storage array 3 includes a goodly number of addressable plural-bit storage locations for storing input control words representing different logical combinations of the binary input signals on the input terminals 2.

The search array subsystem 1 further includes input circuitry 4 for receiving the binary input signals on lines 2 and for receiving input control words one at a time from the input storage array 3 and producing binary truth signals on a search array output line 5 which indicate the states of agreement between the input signal conditions and the logical combinations represented by the input control words. This input circuitry 4 includes, for each of the different input signal lines 2 a separate Select and Compare (S/C) circuit 6. Each Select and Compare circuit 6 also receives two control word bit lines from the input storage array 3. The outputs of all of the Select and Compare circuits 6 are connected to different inputs of an AND circuit 7. AND circuit 7 produces on its output line 5 the binary truth signals which indicate the agreement or lack of agreement of the input signals with the successive ones of the input control words from the input storage array 3.

Figures 2, 3:
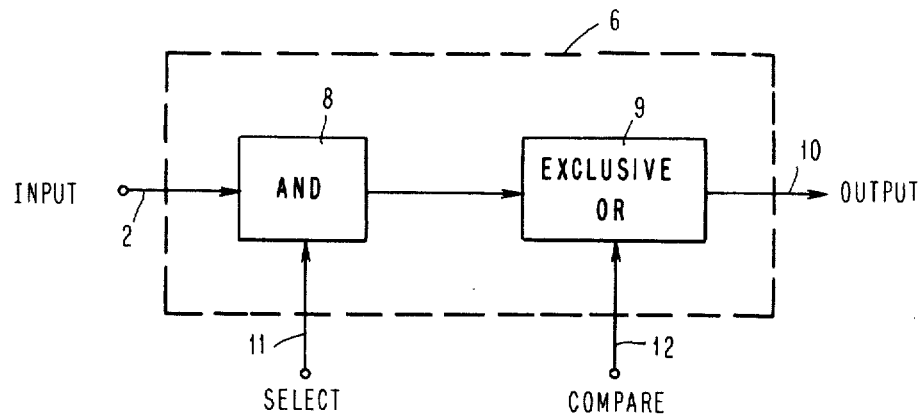
FIG. 2 shows a typical form of construction for the select and compare circuits of FIG. 1.
FIG. 3 is a chart used in explaining the operation of the select and compare circuits of FIG. 2.

FIG. 2 shows a typical form of construction for one of the Select and Compare circuits 6 of FIG. 1. As indicated in FIG. 2, such circuit may comprise an AND circuit 8 coupled in cascade with an EXCLUSIVE OR circuit 9, the output line 10 of the EXCLUSIVE OR circuit 9 being the line that runs to the input of the AND circuit 7 of FIG. 1. The two control word bit lines running to the circuit 6 are identified as a Select line 11 and a Compare line 12.

The table of FIG. 3 explains the operation of the FIG. 2 circuit. If it is desired to deselect the input signal line 2 so that it will have no effect on the resulting truth signal at the output of AND circuit 7, then the control word bits in the storage array 3 are programmed to supply a binary 0 signal to the Select line 11 and a binary 1 signal to the Compare line 12. This locks the output line 10 at the binary 1 level regardless of the signal condition appearing on the input line 2. Thus, the output of the AND circuit 7 will be independent of and unaffected by the binary signal level on the input line 2 for this deselect case.

Where it is desired to have the input signal condition on line 2 enter into the determination of the resultant truth signal on line 5, the control word bit position which controls the Select line 11 is programmed to have a binary 1 value. Thie bit position which controls the Compare line 12 is then programmed to select the particular input signal level which is allowed to produce a binary 1 level on the output line 10. If the Compare line 12 is programmed with a binary 0 value, then the output line 10 will assume the 1 level whenever the input line 2 assumes the 1 level. If, on the other hand, the Compare line 12 is programmed with a binary 1 value, then output line 10 assumes a 1 level when the input line 2 is at the 0 level. Thus, either the true or the complement value of the input signal on line 2 can be used to produce the 1 level match indication on the output line 10.

The sequential logic array mechanism of FIG. 1 further includes a Read array (OR array) subsystem 13 for producing a plurality of binary output signals on output lines 14. The Read array subsystem 13 includes an addressable storage array 15 for supplying output signal control words for use in establishing the output signal levels on the output lines 14. More particularly, the Read array subsystem 13 includes a plurality 16 of output register stages 17 for providing the binary output signals on the mechanism output lines 14. For sake of example, each of the register stages 17 may take the form of a J-K type flip-flop circuit, in which case the clock input terminals of the different flip-flop circuits 17 are all connected to the truth signal output line 5 of the search array input circuitry 4.

The output storage array 15 includes a goodly number of addressable plural-bit storage locations for storing output control words for controlling the states of the output register stages 17. For the case of J-K type flip-flop register stages, two different control word bit position lines are required for each flip-flop stage 17, one such control word bit line being connected to the J input terminal of the flip-flop and the other such control word bit line being connected to the K input of the flip flop. Thus, depending on the programming of the particular control word which is being read out of the storage array 15 at any given moment, any given flip-flop 17 can be set ($J=1$, $K=0$), reset ($J=0$, $K=1$), toggled ($J=1$, $K=1$), or left unchanged ($J=0$, $K=0$) by the appearance of a binary 1 level signal on the search array output line 5, which line runs to the clock input of each of the flip-flops 17.

The sequential logic array mechanism of FIG. 1 further includes address generating circuitry 18 for sequentially generating a series of different storage addresses and for supplying each such address to the address circuitry of both the input storage array 3 and the output storage array 15 via a common address bus 19. The address generating circuitry 18 may include, for example, a plural-bit address counter 20 which is driven by a free-running clock pulse generator 21. When the address counter 20 reaches its maximum address value, it automatically wraps back to the minimum or zero address value and commences to count up again to the maximum address value. Thus, the various control words in the input storage array 3 and the output storage array 15 are continually being accessed, one after the other, in a sequential manner with the overall sequence being repeated each time the address counter 20 cycles back to the zero address value. For the FIG. 1 embodiment, each address value and, hence, each input control word in the input storage array 3 produces one product term for the input signal lines 2.

The sequential logic array mechanism of FIG. 1 also includes control circuitry responsive to the truth signals appearing on the search array output line 5 for enabling the output register stages 17 to respond to selected output control words. In particular, the output register stages 17 will respond to the output control word being read out of the output storage array 15 if the corresponding input control word being read out of the input storage array 3 causes a binary 1 level signal to appear on the search array output line 5. In order to prevent the system from acting on erroneous storage array output signals that may occur as the storage arrays 3 and 15 are changing from one control word to the next, the search array AND circuit 7 is clocked or controlled by means of delayed clock pulse signals which are supplied thereto from the generator 21 by way of control line 22. These clock pulses on line 22 are of the same frequency as the clock pulses supplied to the address counter 20 but with each individual pulse on the line 22 being delayed a predetermined amount relative to the corresponding pulse supplied to the address counter 20. This delay is selected so as to allow time for the counter 20 to settle down and the new control word to be accessed before the AND circuit 7 is activated by the delayed pulse on the control line 22.

Each of the input and output storage arrays 3 and 15 may have, for example, 256 different addressable storage locations to provide 256 different input control words and 256 different output control words. This provides for the generation of up to 256 different product terms. For this case of 256 addresses, the address counter 20 is an 8-bit counter and the address bus 19 has eight individual bit lines. For the case where the storage arrays 3 and 15 are comprised of bipolar storage circuits, each clock pulse cycle provided by the generator 21 may have a duration of, for example, 100 nanoseconds. For the case of 256 storage locations, this means that a complete scanning of the input storage array 3 takes 25.6 microseconds. For the case where the input and output storage arrays 3 and 15 are of the EPROM type, the clock pulse cycles provided by the generator 21 may have a duration of, for example, 500 nanoseconds. For the case of 256 storage locations, this means that 128 microseconds are required to produce one complete scanning of the input storage array 3.

Alternatively, the size of each of the input and output storage arrays 3 and 15 may instead be selected to provide 512 different storage locations. In this case, the address counter 20 would become a 9-bit counter.

A further point to note is that the input and output storage arrays 3 and 15 need not be two physically separate entities. If a single storage array of sufficient width is available, then the input and output storage arrays 3 and 15 may be different parts of the same physical storage array. For example, if the sequential logic array mechanism is constructed to have eight input lines 2 and eight output lines 14 and if a storage array having a data bit width of 32 bits were available, then the input storage array 3 could occupy the left side of such 32-bit array and the output storage array 15 could occupy the right hand side of such 32-bit array, with the data bit output lines for the two halves running to the appropriate places, namely to the input circuitry 4 and the output register stages 17, respectively.

Figure 4:
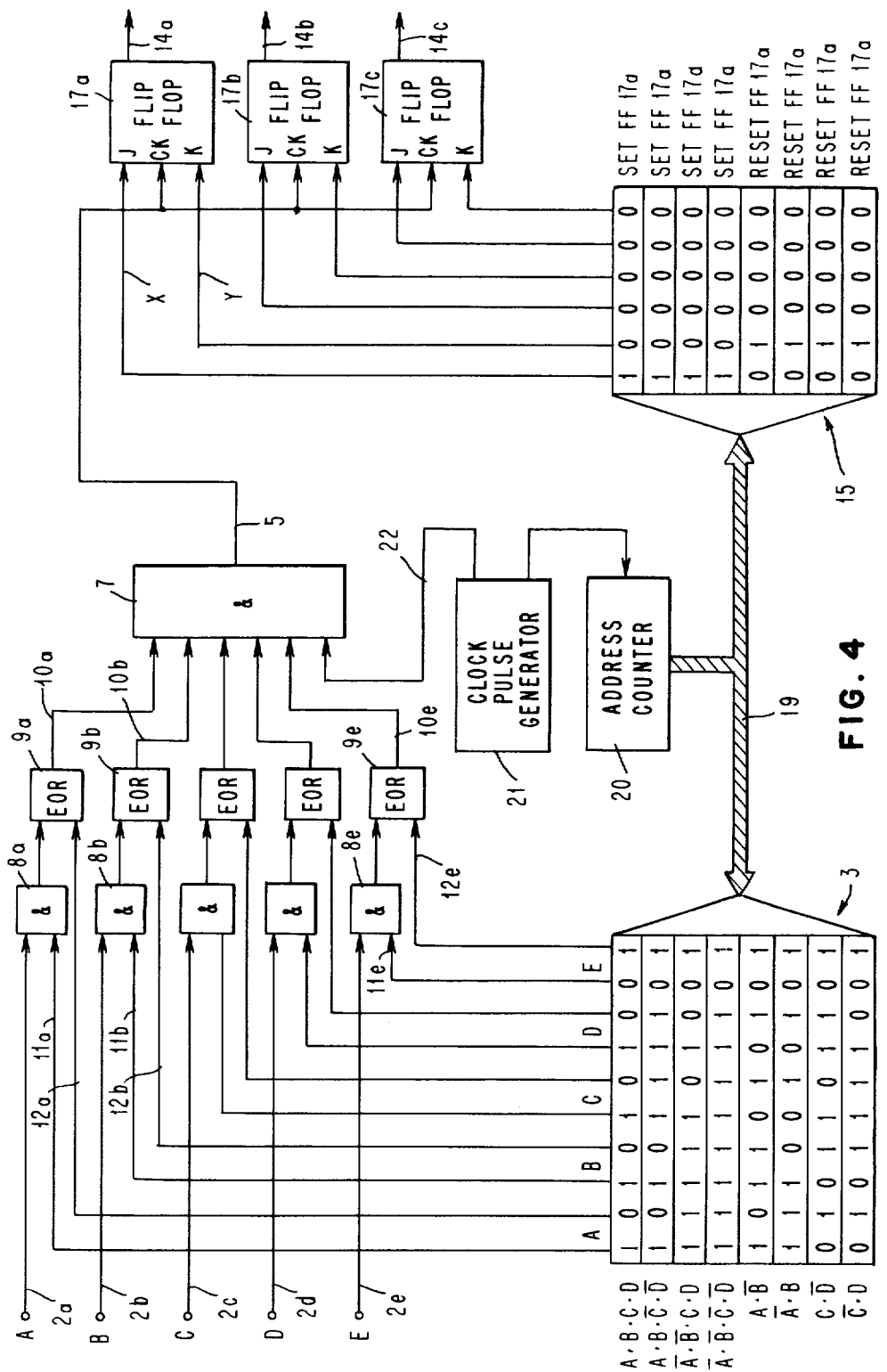
FIG. 4 shows a portion of the same embodiment shown in FIG. 1 and further shows the storage array programming details needed to perform typical representative logical operations.

Referring to FIG. 4, there are shown examples of how the input storage array 3 and the output storage array 15 may be programmed to solve some more or less typical logical equations. In FIG. 4, the multiple elements 2, 8, 9, etc., of FIG. 1 are individually identified by different suffix letters a, b, c, etc. It is also noted that the embodiment shown in FIGS. 1 and 4 uses a logic array technique which is sometimes referred to as "single-bit partitioning".

As a first example, the FIG. 4 mechanism solves the following logical equation:

$$X = (A = B) \cdot (C = D) \tag{1}$$

A, B, C and D denote the input signals on input signal lines 2a, 2b, 2c and 2d, respectively. The symbol X denotes the final result and, as indicated in FIG. 4, the flip-flop circuit 17a is placed in a "set" condition if X is true. Equation (1) represents the case where a first 2-bit code (A, C) is compared with a second 2-bit code (B, D) and a positive indication (X = 1) is produced if the two codes are equal to one another.

Equation (1) can be rewritten as:

$$X = (A \cdot B + \overline{A} \cdot \overline{B}) \cdot (C \cdot D + \overline{C} \cdot \overline{D}) \tag{2}$$

The dot (·) symbol denotes the logical AND function, while the plus (+) symbol represents the logical OR function. The symbol having an overbar represents the logical complement of the unbarred quantity. Equation (2) can be rewritten as:

$$X = (A \cdot B \cdot C \cdot D) + (A \cdot B \cdot \overline{C} \cdot \overline{D}) + (\overline{A} \cdot \overline{B} \cdot C \cdot D) + (\overline{A} \cdot \overline{B} \cdot \overline{C} \cdot \overline{D}) \tag{3}$$

The mechanism of FIG. 4 solves this equation in the form represented by equation (3).

As a second example, the mechanism of FIG. 4 also solves the following logical equation:

$$Y = (A \neq B) + (C \neq D) \tag{4}$$

The final result Y is true if either A is not equal to B or C is not equal to D. As indicated in FIG. 4, the occurrence of Y being true causes the flip-flop circuit 17a to be placed in a reset condition.

The relationship of equation (4) can be rewritten as:

$$Y = (A \cdot \overline{B} + \overline{A} \cdot B) + (C \cdot \overline{D} + \overline{C} \cdot D) \tag{5}$$

This latter form of the relationship is the one solved by the FIG. 4 mechanism.

Considering now the programming shown in FIG. 4 for the input and output storage arrays 3 and 15, it is assumed that the sequencing starts with the uppermost storage location or control word in each array and progresses downwardly word by word until the lowermost control word in each array is reached and accessed. As indicated in FIG. 4, the uppermost or first control word in the input storage array 3 will cause a binary one level pulse to be produced on the search array output line 5 if the first product term of equation (3) is true. If this occurs, it will cause a setting of the flip-flop 17a because only the J input line of this flip-flop is at this moment at the binary one level as is indicated by the uppermost control word in the output storage array 15. In a similar manner, the second control word of the input storage array 3 will produce a one level pulse on the truth signal line 5 if the second product term of equation (3) is true, the third control word will produce a binary one level pulse if the third porduct term is true and the fourth control word will produce a binary one level pulse if the fourth product term is true. An ORing of these four successive product terms is accomplished by the output storage array 15 by the fact that each of the first four control words therein places the J input of the flip-flop 17a at the binary one level. In other words, if any one of these four successive product terms is true, then the flip-flop 17a is "set".

In a similar manner, the next four control words shown in FIG. 4 for the input storage array 3 successively test the input signal lines to successively determine whether any one of the four product terms of equation (5) are true. If any one of these product terms is true, then the flip-flop circuit 17a is "reset" because the corresponding four output control words of the array 15 place only the K input of the flip-flop 17a at the binary one level. Thus, the state of the flip-flop 17a and, hence, the signal level on its output line 14a, indicates whether the coding of the 2-bit signal A, C is equal or unequal to the coding of the 2-bit signal B, D.

A point to note is that the input signal E appearing on the input signal line 2e is not used in the above relationships. This input signal E is prevented from affecting the results by continuously deselecting the input signal line 2e. This is accomplished by the 01 code of the last two bit positions in each of the input control words shown in FIG. 4. Such deselect code causes the EXCLUSIVE OR circuit output line 10e to continuously remain at the binary one level.

A further point to note is that each storage location, and hence each control word, in the input array 3 for the FIG. 4 embodiment is capable of producing only one product term signal.

Figure 5:
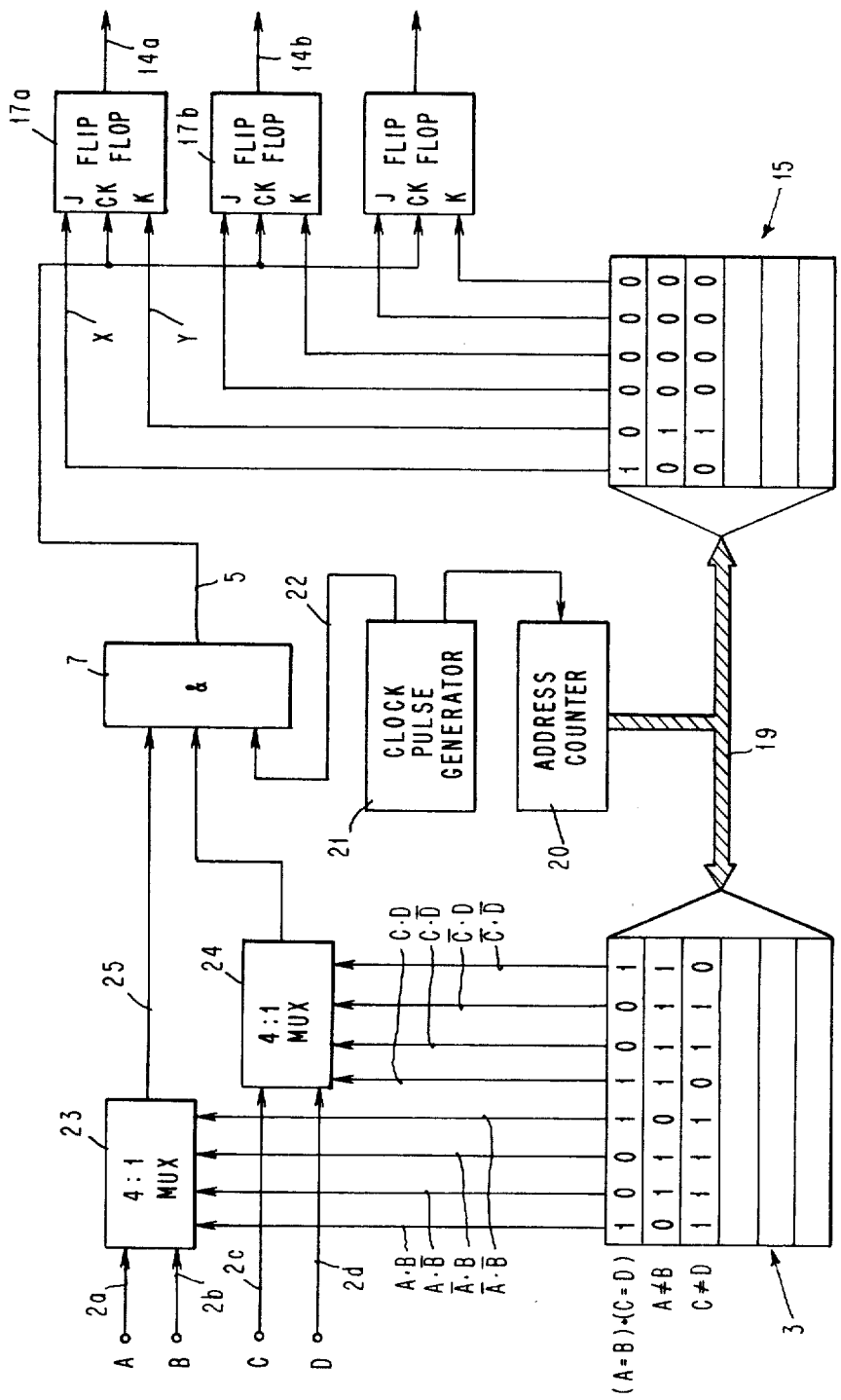
FIG. 5 shows an embodiment of the invention which employs two-bit partitioning.

Referring now to FIG. 5, there is shown an embodiment of the invention which makes use of a technique known as "two-bit partitioning". As will be seen, such technique sometimes reduces the number of control words which are required to solve a logical equation. Except for the input circuitry and the programming of the storage array control words, the embodiment of FIG. 5 is generally similar to the single-bit partitioning embodiment of FIG. 4.

With respect to the input circuitry of FIG. 5, the various input signal lines are grouped in pairs and each pair is connected to a different 4:1 multiplexer circuit. Thus, input signal lines 2a and 2b are connected to a first 4:1 multiplexer circuit 23 and the second pair of input signal lines 2c and 2d are connected to a second 4:1 multiplexer circuit 24. The outputs of all multiplexer circuits, in this example, the multiplexer circuits 23 and 24, are connected to the AND circuit 7 to produce the resultant truth signals on the search array output line 5. As before, the AND circuit 7 is clocked by the delayed clock pulses from the generator 21.

Considering in detail the operation of the first multiplexer circuit 23, the input signal lines 2a and 2b are connected to the "select" input terminals of the multiplexer 23. The "data" input terminals of the multiplexer 23 are, on the other hand, connected to the first four "data" bit lines of the input storage array 3. The operation of the multiplexer 23 is that the binary code appearing at the two "select" input terminals (input signal lines 2a and 2b) selects which one of the four "data" input terminals (lines from storage array 3) is to be connected to the multiplexer output line 25.

As is indicated in FIG. 5, the first four "data" output lines of the storage array 3 are used to represent different ones of the four possible product terms that can be formed by the two input signals A and B. Thus, reading from left to right, the first storage array data line is thought of as corresponding to the product term A·B, the second data line is thought of as corresponding to the product term A·B̄, the third data line is thought of as corresponding to the product term Ā·B and the fourth array data line is thought of as corresponding to the product term Ā·B̄. If the first product term is to be a true term in the logical equation, then a binary one is stored in the first bit position of the control word in question. If this first product term is not to be used, then a binary zero is stored in the first bit position of the control word in question. The other bit positions in a control word are programmed in a similar manner to select or deselect the corresponding product term.

For the uppermost or first control word shown for the input storage array 3 of FIG. 5, the product term data lines for A·B and Ā·B̄ are activated and the other two product term data lines are deactivated or placed at the binary zero level. Thus, for this example, any time the input signal code for input signals A and B is "11", then the A·B data line is connected to the multiplexer output line 25 to place such line at the binary one level. If, on the other hand, the code for input signals A and B is "10", then the A·B̄ data line is connected to the multiplexer output line 25 to place such line at a binary zero level. Similarly, an input signal code of "01" selects the Ā·B line and a code of "00" selects the Ā·B̄ line. Only those control word bit positions which contain binary one values will cause the occurrence of a binary one level on the multiplexer output line 25.

The table of FIG. 6 shows the different logical relationships that can be provided by the multiplexer 23, depending on the binary coding of the first four bit positions of each control word. Thus, 14 different logical functions or logical combinations of the input signals A and B can be provided by the multiplexer circuit 23. Also, the "1111" control word code is usable for deselecting the multiplexer circuit 23 when it is desired that the input signals A and B should not have any effect on the truth signal appearing on the search array output line 5.

The second multiplexer 24 functions in the same manner for the second pair of input signals C and D as does the multiplexer 23 for the first pair of input signals A and B. Thus, the table of FIG. 6 also applies to the second multiplexer 24, provided that the letter A is replaced by the letter C and the letter B is replaced by the letter D. Obviously, additional pairs of input terminals and additional multiplexer circuits can be added so as to increase the total number of input signal lines. The width of the input storage array 3 must be increased by four additional bit positions for each additional multiplexer circuit.

As a further alternative, higher degrees of bit partitioning can be used, where desired, by using different sizes of multiplexer circuits. Thus, for example, four-bit partitioning can be accomplished by grouping the input lines into groups of four and connecting each such group to a 16 line to 1 line multiplexer circuit. Each such multiplexer circuit would then require a different set of 16 data lines from the input storage array.

The storage array programming examples given in FIG. 5 solve the same two logical relationship as described above for the FIG. 4 embodiment. In particular, the first or uppermost control word in the input storage array 3 of FIG. 5 solves the relationship for X in the form described above in equation (2). This can be verified by referring to the table of FIG. 6. Thus, in this embodiment, the basic equality relationship expressed by equation (1) is solved by a single control word, as opposed to the four control words required in the FIG. 4 embodiment.

The second and third control words of the input storage array 3 of FIG. 5 solve the relationship of equation (5) for the value Y. In this case, two control words are required to obtain the two terms enclosed in parentheses in equation (5). These two terms are then ORed by the second and third control words in the output storage array 15 to obtain the desired overall result. By way of comparison, the FIG. 4 embodiment required a total of four control words to accomplish this same result.

As seen from the foregoing examples, the use of the two-bit partitioning technique shown in FIG. 5 will sometimes serve to reduce the number of control words which are required. This allows a greater number of control functions to be performed by a given number of control words.

For the FIG. 5 embodiment, the quantity represented by the occurrence of a binary one level pulse on the search array output line 5 is not, strictly speaking, a "product term". As indicated by equation (2), a one level pulse on line 5 (denoting X=1) represents something more than merely a "product term". This something more will be referred to herein as a "word term". Thus, the right hand side of equation (2) represents a "word term" and if this word term is true (X=1), then a binary one level pulse is produced on the search array output line 5. Thus, the expression "word term" as used in the sequential logic array context corresponds to the usage of the term "word line" for the case of known two-bit partitioned programmable logic arrays. Thus, for the case of two-bit partitioning, the sequential logic array of the present invention will have a number of control words which is equal to the number of word lines which are used in a known PLA for performing the same function.

Actually, and more accurately, the expression "word term" is a generic expression which includes all of the types of quantities shown in the "Function" column of the FIG. 6 table. Thus, the expression "word term" includes single signal terms, OR terms, product (AND) terms and combinations of OR and product terms.

Figure 7:
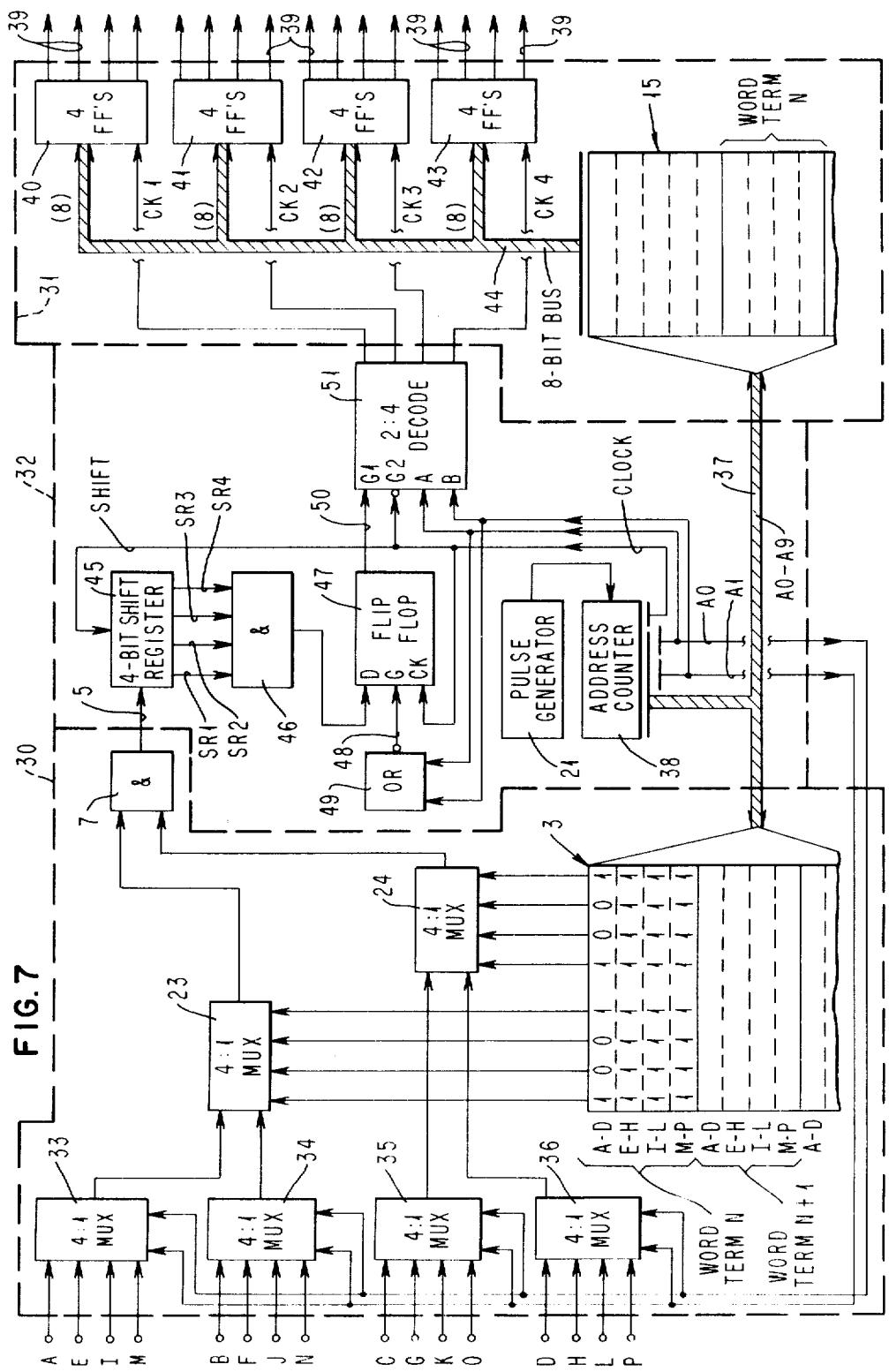
FIG. 7 shows an embodiment of the invention which employs multiplexing of the inputs and outputs of the sequential logic array.

Referring to FIG. 7, there is shown a further embodiment of the invention which in addition to the two-bit partitioning technique of FIG. 5 also employs multiplexing of the input and output signal lines of the sequential logic array. This enables a greater number of input and output lines to be accommodated. In FIG. 7, the search array subsystem is included within the dashed line bounded area 30, the read array subsystem is included within the dash line bounded area 31, and a control subsystem is located within the dash line bounded area 32.

There are 16 input signal lines from the external world, these being identified as A through P. These input lines are grouped into groups of four and each group of four is connected to the "data" input terminals of a different one of a set of four 4:1 multiplexer circuits 33, 34, 35 and 36. The "data" outputs of the two multiplexers 33 and 34 are connected to the two "select" terminals of the logic solving multiplexer 23 and the two "data" output terminals of the multiplexers 35 and 36 are connected to the two "select" terminals of the second logic solving multiplexer 24. The logic solving multiplexers 23 and 24 function in the same manner as described above in connection with FIG. 5. The input time sharing multiplexers 33-36, on the other hand, simply provide different input signals to the logic solving multiplexers 23 and 24 at different times.

The time sharing or time multiplexing action of multiplexers 33-36 is controlled by the A0 and A1 address lines which are connected to the "select" terminals of each of the four input multiplexers 33-36. The operation is such that during a first time slice interval, input signals A-D are supplied to the logic solving multiplexers 23 and 24, during a second time slice interval, input signals E-H are supplied to the multiplexers 23 and 24, during a third time slice interval, input signals I-L are supplied to the multiplexers 23 and 24 and during a fourth time slice interval, input signals M-P are supplied to the logic solving multiplexers 23 and 24. This 1, 2, 3, 4 time slice sequence is then repeated over and over again in a repetitive manner.

As indicated for the input storage array 3 shown in FIG. 7, four successive control words are required to produce a complete word term for the complete set of 16 input signals A-P. In other words, the 16 input lines are scanned or sampled four at a time and hence four separate control words, one for each of the different sampling intervals, are required for a complete sampling of all 16 input lines. The selection of the four successive control words in each word term group is controlled by the same A0 and A1 address lines as are controlling the input multiplexers 33-36, these address lines also being the two low order address lines in the address bus 37 which runs to the address circuitry of the input storage array 3. This same address bus 37 also runs to the address circuitry of the output storage array 15.

Assuming the same example as before, namely, that it is desired that the sequential logic array mechanism should be capable of providing up to 256 different word terms, then since each word term includes four control words, it now becomes necessary for the input and output storage arrays 3 and 15 to each have 1024 addressable control word storage locations. Thus, the address bus 37 is a 10-bit address bus, the different bit lines being identified as A0 through A9. The storage addresses appearing on the address bus 37 are generated by an 11 bit address counter 38 which is driven by the free-running pulse generator 21. The lowest order stage in the address counter 38 is used to generate a clock signal which is used in the operation of the control circuitry to be described hereinafter. This clock signal is not applied to the address bus 37. Only the ten higher order stages of the address counter 38 are connected to the address bus 37.

The sequential logic array mechanism of FIG. 7 also includes 16 output signal lines 39 which are also controlled in a time multiplexed manner. Each of the output signal lines 39 is controlled by its own individual flip-flop circuit output register stage and, for sake of example, these output register stages are assumed to be J-K type flip-flop circuits. For purposes of time multiplexing, these output flip-flop circuits are grouped in groups of four, the first group of four being indicated at 40, the second group of four being indicated at 41, the third group of four being indicated at 42, and the fourth group of four being indicated at 43. These four flip-flop groups 40-43 are clocked in a successive manner during four successive time slice intervals by time spaced clock pulses CK1, CK2, CK3 and CK4. As will be seen, these CK1-CK4 clock pulses are derived from the same A0 and A1 address signals which are synchronizing the operations of the input multiplexers 33-36 and the storage arrays 3 and 15.

The output storage array 15 also requires the use of four successive control words in order to provide the output multiplexing for a complete word term. These four control words are applied one at a time in a sequential manner to an output "data" bus 44 for the output storage array 15. During the appearance of the first control word of a word term group on the bus 44, the clock signal CK1 is applied to each of the four flip-flops in the first flip-flop group 40. In a similar manner, the second clock pulse CK2 occurs during the appearance of the second control word on the bus 44, the third clock pulse CK3 occurs during the appearance of the third control word on the bus 44 and the fourth clock pulse CK4 occurs during the appearance of the fourth control word on the bus 44. Since two storage array "data" bit lines are required for each flip-flop circuit, each of the output storage array 15 and the storage array output bus 44 have a width of eight bits.

Considering now the control subsystem 32, the strategy is to look at the results of each complete multiplexing cycle (each complete scanning of the 16 input signal lines A-P) and see if four successive binary one level pulses have occurred on the search array output line 5. If they have, this means that the complete word term is true and that one or more of the output flip-flop stages in flip-flop groups 40-43 needs to be updated. This is then accomplished by multiplexing the control words of the proper word term group in output storage array 15 to the flip-flop groups 40-43, the updating being controlled by the programming or coding of these control words.

If, on the other hand, a complete multiplexing cycle does not produce four successive one level pulses on the search array output line 5, then the corresponding word term is not true and no updating of the output flip-flop circuits is required.

The operation of the control circuits for accomplishing these purposes will now be described with the aid of the timing diagram shown in FIG. 8. For sake of example, it is also assumed that the word term "N" shown for the input storage array 3 in FIG. 7 solves the logical relationship for the quantity X as described above by equation (2). Since equation (2) involves only the input signals A-D, the other input signals E-P must be deselected for the word term N. This deselection is accomplished by storing binary one values in each of the bit positions in each of the second, third and fourth control words for the word term N. The first control word in the group, namely, the control word for input signals A-D, is the one that actually does the equation solving in this particular example.

As indicated in FIG. 7, the search array output line 5 is connected to the input of a four-bit shift register 45. The outputs of the four shift register stages are connected in parallel to an AND circuit 46. Thus, the shifting in of four successive binary one level values into the shift register 45 will cause the AND circuit 46 to produce a one level output signal which is supplied to the data (D) input terminal of a flip-flop circuit 47.

Figure 8:
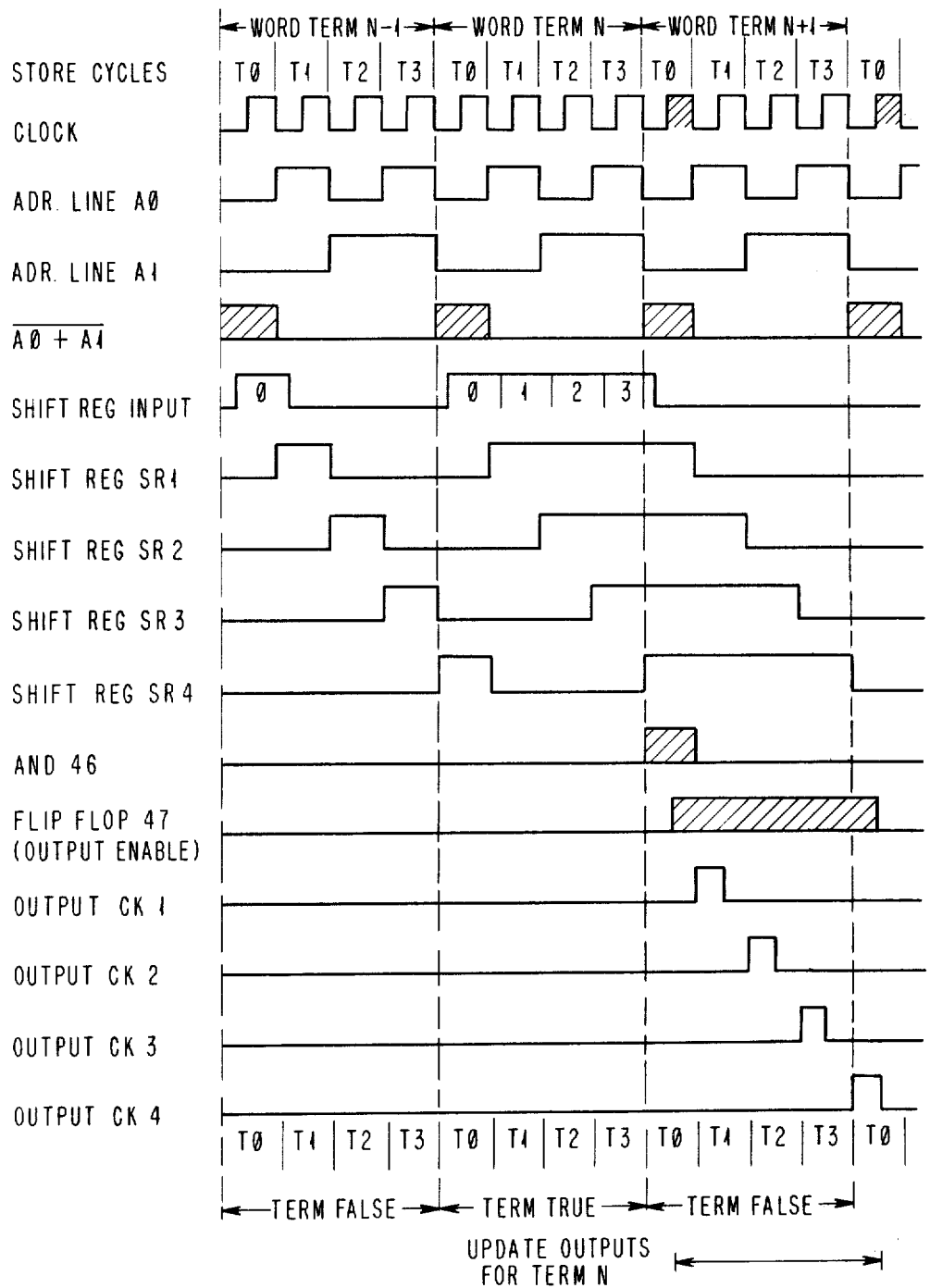
FIG. 8 is a timing diagram used in explaining the operation of the FIG. 7 embodiment.

In terms of the timing diagram of FIG. 8, the signals appearing on the search array output line 5 are indicated by the waveform identified as "Shift Register Input". The "data" on line 5 is shifted into the shift register 45 by the negative going transitions in the "Clock" waveform. There is one such transition for each control word access of the input storage array 3, with the transition occurring near the end of the control word cycle (storage cycle) just before the next control word is selected or accessed. Thus, the result of each control word testing of the input signals is, in its turn, shifted into the shift register 45.

As indicated in FIG. 8, it is assumed that the word term N−1 multiplexer cycle does not produce four successive one level signals into the shift register 45. In other words, it is assumed that the N−1 word term is false. Conversely, it is assumed that the word term N is true and, hence, that four successive binary one values are shifted in to the shift register 45 for this multiplexer cycle. These four successive binary one values cause the shift register output lines SR1-SR4 to have extended binary one level pulses which overlap during the first or T0 control word cycle of the next N+1 word term interval. This produces at the output of AND circuit 46 the one level pulse indicated by the "AND 46" waveform of FIG. 8.

In terms of what is allowed to get in to the flip-flop 47, the output of AND circuit 46 is sampled during the T0 portion of each word term by a pulse appearing on output line 48 of OR circuit 49. This flip-flop gating pulse is represented by the $\overline{A0+A1}$ waveform of FIG. 8 and results from the logical combining of the A0 and A1 address signals by the OR circuit 49 with a signal inversion occurring at the output of OR circuit 49. Thus, the positive-going edge of the clock signal occurring during the T0 interval causes the flip-flop 47 to be "set" if the output of AND circuit 46 is a binary 1 level and to be "reset" if the output of AND circuit 46 is a binary 0 level. Thus, the four successive binary 1 values on search array output line 5 during the word term N interval cause the flip-flop 47 to be "set" during the T0 interval of the next word term N+1. This sets the output line 50 of the flip-flop 47 to the binary 1 level. This binary 1 level signal constitutes an "output enable" signal and is represented by the shaded portion of the "flip-flop 47" waveform of FIG. 8.

This output enable signal on line 50 enables a 2:4 decoder circuit 51 to become operative to cause a multiplexing of the four word term N output control words to the four groups of flip-flops 40-43. The 2:4 decoder 51 decodes the A0 and A1 address signals to produce the four successive time spaced clock pulses CK1-CK4 represented by the lower four waveforms in FIG. 8. The decoder 51 is also enabled by the clock pulses from the counter 38 so that the resulting CK1-CK4 pulses are of the same width as the negative-going portions of these clock pulses. As is apparent from FIG. 8, the updating of the output register stages for the word term N is done while the search array subsystem 30 is doing its operations for the next word term N+1. Thus, the updating of the outputs for one word term overlaps the processing of the inputs for the next word term.

Figure 9:
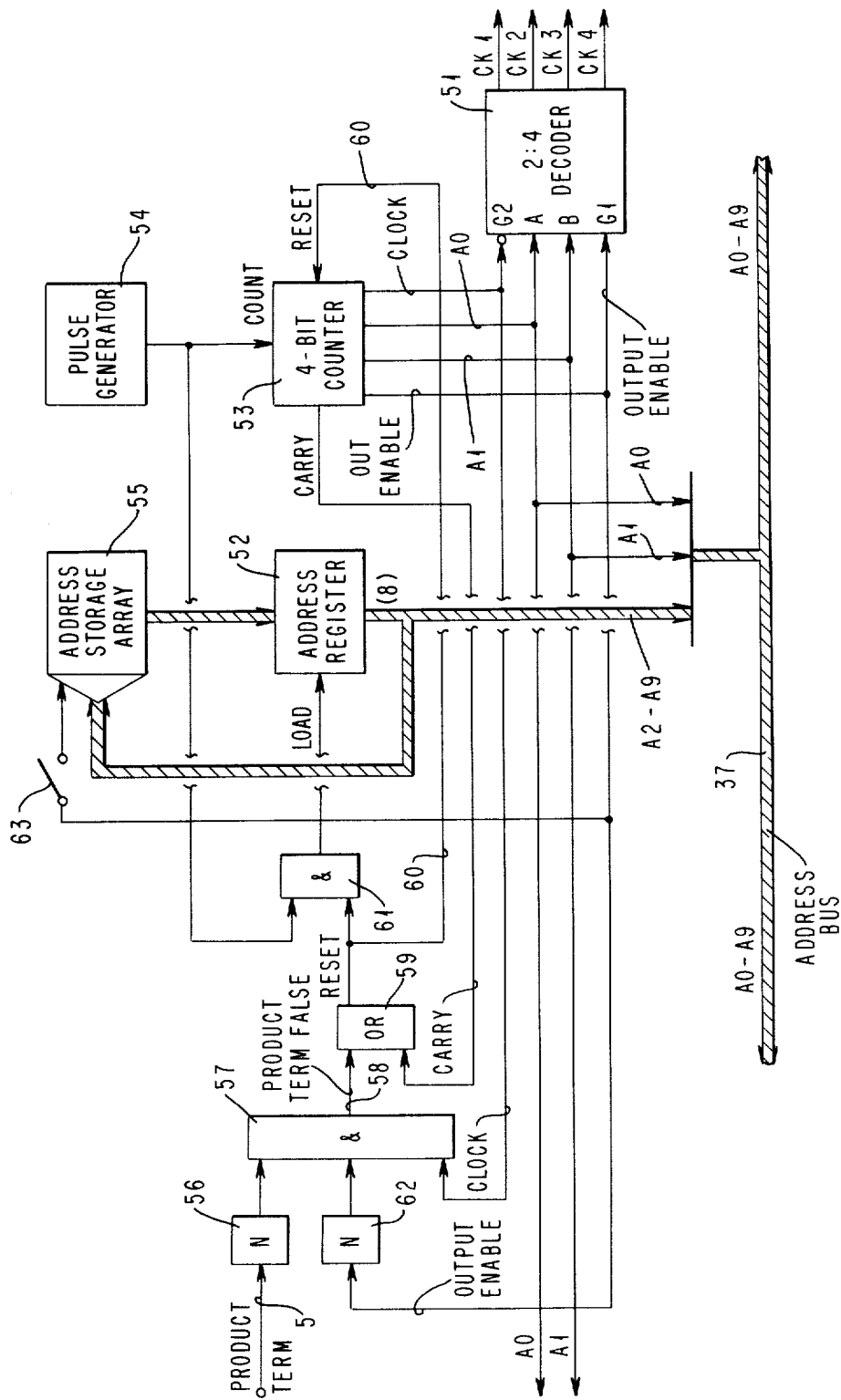
FIG. 9 shows a modified form of control subsystem that can be used in the FIG. 7 embodiment.

Referring now to FIG. 9, there is shown a modified form of control subsystem which can be used in place of the control subsystem 32 of FIG. 7. The strategy employed in the FIG. 9 control subsystem is to reset or restart the input multiplexing cycle anytime the search array subsystem produces a "false term" indicating output signal. As will be seen, this enables a skipping of the four output control word cycles and any remaining input control word cycles whenever the input signals being tested by a particular input control word produce a false product term or subword term indication. This serves to shorten the time required to handle false product terms and thus to improve the overall response time of the sequential logic array mechanism as a whole.

The FIG. 9 control subsystem uses a different form of address generating circuitry relative to that previously considered. In FIG. 9, an 8-bit address register 52 is provided for holding a "base" address. At the same time a 4-bit counter 53 is used to generate a "displacement" address value which, when added to the base address of the address register 52, provides the complete address for a single particular control word in each of the storage arrays 3 and 15. More particularly, the base address in register 52 denotes the starting address for a word term in the input storage array 3 and the A0 and A1 bit lines from the counter 53 serve to increase such base address value by a value of either 0, 1, 2 or 3 so as to address a particular control word in the selected word term. In other words, the base address in register 52 selects the word term group and the displacement address provided by the A0 and A1 bit lines of counter 53 selects the particular control word within the selected word term group.

The 4-bit counter 53 is driven by a free-running clock pulse generator 54. The lowest order stage of the counter 53 is used to provide a clock pulse output to provide internal clock pulses for the control subsystem being considered. The fourth or highest order stage of the counter 53 provides, when appropriate, an "output enable" signal for the 2:4 decoder 51.

The addresses appearing in the 8-bit address register 52 are determined by a set of addresses stored in an address storage array 55. The 8-bit output of the 8-bit address register 52 is supplied back to the address circuitry of the address storage array 55. The storage location being accessed at any given moment in the storage array 55 contains the "next address" value which is to be loaded into the address register 52. This is accomplished by the appearance of a "load" pulse at the load terminal of the address register 52. Such load pulse loads the "next address" into the address register 52, which then becomes the "present address". This present address then addresses another storage location in the storage array 55 to access the new "next address".

For the moment, it is assumed that the storage array 55 is loaded with address values so as to produce a sequence of addresses which are in numerical order and which run from 0 through 255. In order words, it is assumed for the moment that storage location 0 contains the address of storage location 1, storage location 1 contains the address of storage location 2, storage location 2 contains the address of storage location 3, et cetera. As a final matter, storage location 255 contains the address of storage location 0. Thus, the system operates in a wrap back mode to automatically recycle itself. Alternative address sequencing possibilities will be discussed hereinafter.

Each word term or product term signal appearing on the search array subsystem output line 5 is inverted by a NOT circuit 56 and then tested by an AND circuit 57. For the moment, the "Output Enable" line is assumed to be at the 0 level. The clock pulses from the first stage of the counter 53 are supplied to a third input of the AND circuit 57. The positive-going portion of the clock waveform serves to test the successive product terms on search array output line 5. If the product term is true (binary 1 level on line 5), then the clock pulse is not passed to the AND circuit output line 58. If, on the other hand, the product term is false, then the clock pulse is passed by the AND circuit 57 and appears as a pulse on the output line 58. Thus, a pulse on AND circuit output line 58 denotes the occurrence of a false product term. Such "product term false" pulse is passed by way of an OR circuit 59 and a reset line 60 to cause a resetting to zero of the 4-bit counter 53. This "product term false" pulse also enables the next pulse from generator 54 to be passed by an AND circuit 61 to the "load" terminal of the address register 52. This loads the next base address, which is the starting address for the next word term control word group, into the address register 52. Thus, anytime a false product term is encountered, the remainder of the control words for that particular word term are skipped and the mechanism immediately starts to use the control words for the next word term.

Figure 10:
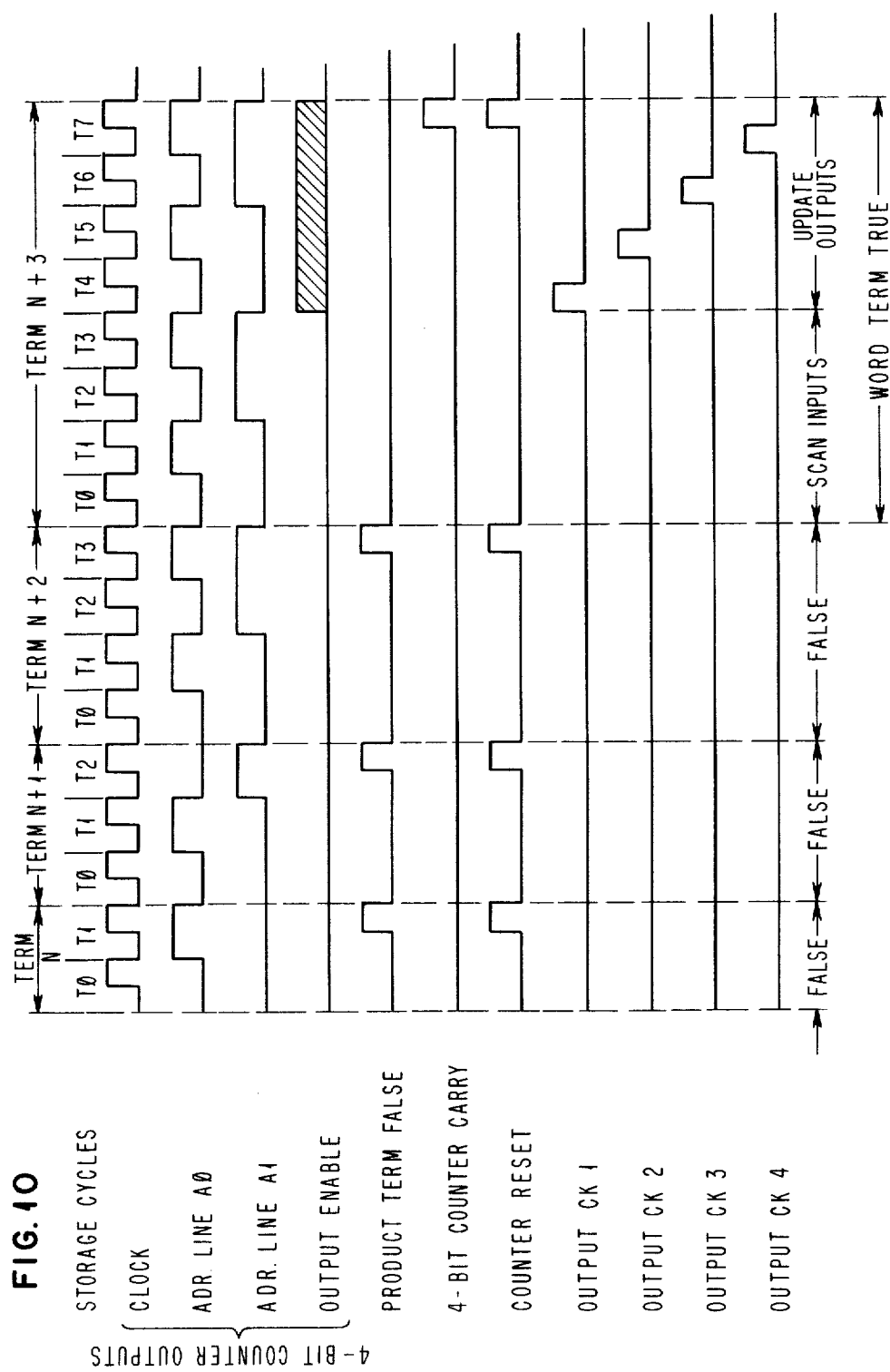
FIG. 10 is a timing diagram used in explaining the operation of the FIG. 9 control subsystem.

FIG. 10 shows a timing diagram for the control subsystem being considered. The waveform of FIG. 10 labeled "product term false" shows the pulses produced on the AND circuit output line 58 by the false product terms. An examination of the upper four waveforms in FIG. 10, which represent the waveforms on the four output lines of the counter 53, shows that the counter 53 is, in fact, reset by each of these product term false pulses.

This resetting of the counter 53 will continue until such time as four successive control word cycles (T0, T1, T2, et cetera) pass without the occurrence of a false product term pulse. When this happens, the next ensuing count in the counter 53 turns on the high order stage in the counter 53, which, in turn, turns on or places the "output enable" line at the binary 1 value. This switches the system to an "update outputs" mode. In particular, the 1 value on this output enable line is inverted by a NOT circuit 62 to shut down the operation of the AND circuit 57. Thus, no more false product term pulses are produced until after the completion of the update operations for the output flip-flops 40-43.

The binary one level on the output enable line during the update mode also activates or enables the 2:4 decoder 51. This enables the decoder 51 to commence decoding the A0 and A1 address signals to produce the four successive clock pulses CK1, CK2, CK3 and CK4. This enables the updating of the output register stages in the manner previously considered in connection with FIG. 7.

Immediately after the last output stage clock pulse CK4 is generated, the counter 53 reaches a full count condition and then cycles back to a zero count condition. This produces an overflow pulse or carry pulse on the carry output line of the counter 53. This carry pulse is supplied by way of the OR circuit 59 to enable the AND circuit 61 to pass the next pulse from generator 54 to the load terminal of the address register 52. This advances the address register 52 to the next base address value at the same time that the 4-bit counter 53 returns to its zero value. This commences the addressing of the control words for the next word term group. The recycling of the counter 53 to zero also turns off the output enable line to disable the decoder 51 and to reactivate the AND circuit 57 which produces the false product term pulses.

As seen from the foregoing, the control subsystem of FIG. 9 saves time by skipping the four output update control word cycles and any remaining input control word cycles whenever a false product term is detected for an input control word.

Further improvements in operation can be achieved by modifying the address storage array 55 and its addressing. In particular, if the capacity of the address storage array 55 is doubled to provide 512 storage locations and if the switch 63 is closed to provide a ninth address line to the storage array 55, then some interesting possibilities arise. This ninth address line via switch 63 enables the provision of two possible next control word addresses for each control word term being tested, the particular one of the two addresses which is selected being determined by the state of the output enable line of the counter 53. In particular, since this output enable line is low when the reset signal is generated for a false product term and is high when the reset signal is generated for a true product term, the next address in the sequence can be controlled by the results of the product term test. This feature can be used to create loops or to skip certain word term groups in the addressing of the storage arrays 3 and 15. This, in turn, can be used to provide significant improvements in both flexibility and response time for the overall operation of the sequential logic array mechanism.

Returning now to FIG. 1 of the drawings, one further matter is of importance and should be discussed, namely, the loading of the input and output storage arrays 3 and 15 where such storage arrays are comprised of read/write type storage circuits. In this case, the storage arrays 3 and 15 are initially loaded with the desired control word bit patterns by means of an external source of digital signals. For this initial loading, the counting input of the address counter 20 is disconnected from the clock pulse generator 21 and is instead connected to receive timing pulses or synchronizing pulses from the external mechanism which are in step with the digital words being supplied to the Write data input lines (not shown) of the storage arrays 3 and 15. Also, the Write Enable terminals of the storage arrays 3 and 15 would need to be enabled.

This initial program loading of the input and output storage arrays 3 and 15 can be accomplished by a general purpose computer or data processor by making the appropriate connections to the data processor I/O bus and by providing such data processor with the appropriate initial program load instructions as well as with a copy of the program (control word bit patterns) to be loaded. Alternatively, special purpose circuitry may be provided which is designed for the sole purpose of providing the initial program loading with the program to be loaded being obtained from, for example, a magnetic tape cassette type unit or a magnetic floppy disk type unit. To carry the reasoning one step more, a further alternative would be to provide a special set of pushbutton switches for enabling the storage arrays to be loaded and the address counter to be advanced in a more or less manual manner by manual operation of such switches.

The use of read/write type storage arrays for the input and output storage arrays makes it quite easy to change the logical operations performed by the sequential logic array mechanism. Also, where desired, such changes can be made in a dynamic realtime manner. On the other hand, for those applications where it is undesirable to do an initial loading each time the logic array mechanism is powered up or turned on, then eraseable programmable read only memory (EPROM) arrays may be used to provide the input and output storage arrays.

These initial program loading considerations for the input and output storage arrays of FIG. 1 are equally applicable to the input and output storage arrays of the other embodiments described in connection with FIGS. 5, 7 and 9.

While there have been described what are at present considered to be preferred embodiments of this invention, it will be obvious to those skilled in the art that various changes and modifications may be made therein without departing from the invention, and it is, therefore, intended to cover all such changes and modifications as fall within the true spirit and scope of the invention.

What is claimed is:

1. A programmable sequential logic array mechanism for performing logical operations and solving logical equations and comprising:
an input random access storage array having addressable plural-bit sotrage locations for storing input control words for testing for different input signals conditions;
input circuitry for receiving a plurality of binary input signals and for receiving input control words from the input storage array and producing binary truth signals indicating the states of agreement between the input signal conditions and the test conditions represented by the input control words;
a plurality of binary output bistable circuits for providing a plurality of binary output signals;
an output random access storage array having addressable plural-bit storage locations for storing output control words for controlling the states of the binary output bistable circuits;
address generating circuitry for sequentially generating a series of different storage addresses and for supplying each such address to the address circuitry of both the input and the output storage arrays, for sequentially reading out the desired control words;
and control circuitry connecting the input circuitry with binary output bistable circuits and responsive to the truth signals produced by the input circuitry for enabling the binary output bistable circuits to respond to selected output control words.

2. A programmable sequential logic array mechanism in accordance with claim 1 wherein the input circuitry includes:
circuitry for comparing each input signal with a different bit position in an input control word for producing a comparison signal indicating the relative truth value of the input signal;
and a logic circuit responsive to the various comparison signals for producing a binary truth signal indicating whether the various input signals as a group correspond to the logical conditions specified by the input control word.

3. A programmable sequential logic array mechanism in accordance with claim 1 wherein:
each storage location in the input storage array includes two bit positions for each input signal;
the input circuitry includes for each input signal a selector circuit followed by a compare circuit, with one input storage array bit position for each input signal being connected to a different one of the selector circuits and the other bit position for each input signal being connected to a different one of the compare circuits;
and the input circuitry includes a logic circuit for receiving the outputs of all of the compare circuits and producing an output truth signal of predetermined truth value when the outputs of all of the compare circuits have an identical predetermined truth value.

4. A programmable sequential logic array mechanism in accordance with claim 3 wherein each selector circuit is an AND circuit, each compare circuit is an EXCLUSIVE OR circuit and the logic circuit is an AND circuit.

5. A programmable sequential logic array mechanism in accordance with claim 1 wherein the address generating circuitry is comprised of an address counter driven by a free-running clock pulse generator.

6. A programmable sequential logic array mechanism in accordance with claim 1 wherein the input circuitry includes circuitry for providing plural-bit partitioning of the input signals.

7. A programmable sequential logic array mechanism in accordance with claim 6 wherein:
the input signals are divided into groups;
a multiplexer circuit is provided for each group of input signals;
the input signals of each group are supplied to the select inputs of its multiplexer circuit;

the input storage array supplies to the data inputs of each multiplexer a plurality of signals representing different product term combinations for the input signals in such group;

and the outputs of the various multiplexer circuits are connected to a logic circuit which produces for each input control word a binary truth signal indicating the state of agreement between the various input signal conditions and the logical combination represented by the input control word, the various successive binary truth signals produced by this logic circuit being the truth signals to which the control circuitry is responsive.

8. A programmable sequential logic array mechanism in accordance with claim 6 wherein:

each pair of input signals is connected to the select input terminals of a different four-to-one multiplexer circuit;

the four data terminal inputs of each such multiplexer circuit is connected to a different group of four control word output lines of the input storage array;

and the data output terminals of the different multiplexer circuits are coupled to a logic circuit for producing the binary truth signals to which the control circuitry is responsive.

9. A programmable sequential logic array mechanism in accordance with claim 1 and including:

circuitry for time multiplexing input signals into the input circuitry;

and circuitry for synchronizing the addressing of the input and output storage arrays with the input signal multiplexing for providing different input and output control words for each set of the time multiplexed input signals.

10. A programmable sequential logic array mechanism in accordance with claim 9 wherein:

the input circuitry includes a plurality of input signal lines;

the sequential logic array mechanism includes a separate multiplexer circuit for each input signal line for time multiplexing N different input signals onto each such input signal line;

the control words in the input and output storage arrays are organized in groups of N successive control words, different control words in each group corresponding to the different ones of the N sets of signals which are time multiplexed onto the input signal lines;

and the control circuitry includes circuitry for detecting for each repetition of the multiplexing of the N sets of input signals the occurrence of N successive truth signals of the same predetermined truth value for enabling N groups of output stages to respond to different ones of the control words in the corresponding group of N output control words.

11. A programmable sequential logic array mechanism in accordance with claim 10 wherein the control circuitry includes circuitry responsive to the occurrence of a truth signal having a value opposite to the predetermined value for resetting the multiplexing sequence and for advancing the address generating circuitry to the starting address for the next group of N control words.

* * * * *